(12) United States Patent
Higuchi

(10) Patent No.: US 8,139,053 B2
(45) Date of Patent: Mar. 20, 2012

(54) ARRANGEMENT FOR CANCELING OFFSET OF DRIVER AMPLIFIER CIRCUITRY

(75) Inventor: Koji Higuchi, Ibaraki (JP)

(73) Assignee: Oki Semiconductor Co., Ltd. (JP)

( * ) Notice: Subject to any disclaimer, the term of this patent is extended or adjusted under 35 U.S.C. 154(b) by 1035 days.

(21) Appl. No.: 12/052,153

(22) Filed: Mar. 20, 2008

(65) Prior Publication Data

US 2008/0303577 A1    Dec. 11, 2008

(30) Foreign Application Priority Data

Apr. 19, 2007    (JP) .................................. 2007-110204

(51) Int. Cl.
G06F 3/038     (2006.01)
G09G 5/00      (2006.01)
G09G 3/36      (2006.01)
H03L 5/00      (2006.01)
H03F 1/02      (2006.01)

(52) U.S. Cl. .......... 345/204; 345/98; 345/100; 327/307; 330/9

(58) Field of Classification Search .................. 327/307, 327/309; 330/9, 252–253, 260; 345/84–107, 345/204

See application file for complete search history.

(56) References Cited

U.S. PATENT DOCUMENTS

| 6,448,836 | B2 |   | 9/2002 | Kokubun et al. |
|---|---|---|---|---|
| 7,336,124 | B2 | * | 2/2008 | Kasai et al. ................... 327/307 |
| 7,423,479 | B2 | * | 9/2008 | Higuchi ............................ 330/9 |
| 7,576,603 | B2 | * | 8/2009 | Higuchi ............................ 330/9 |
| 7,642,600 | B1 | * | 1/2010 | Wert ............................ 327/309 |
| 7,746,310 | B2 | * | 6/2010 | Ahn ............................. 345/100 |

* cited by examiner

Primary Examiner — Bipin Shalwala
Assistant Examiner — Ryan A Lubit
(74) Attorney, Agent, or Firm — Studebaker & Brackett PC; Donald R. Studebaker

(57) ABSTRACT

In an offset canceling arrangement, an offset of an operational amplifier may be canceled even in case capacitive or resistive element is connected outside of the operational amplifier per se, and a signal may be output even during the offset canceling operation. IC chips include respective sets of plural output circuits. Each of the IC chips is provided with an offset canceling function, for which the respective sets of output circuits are grouped into plural groups. A reference signal for offset canceling is generated from a reference output circuit. One of the groups, each constituting one IC chip, is selected, and the reference signal for offset canceling generated by the group is used as a reference signal for offset canceling for the remaining group(s).

1 Claim, 7 Drawing Sheets

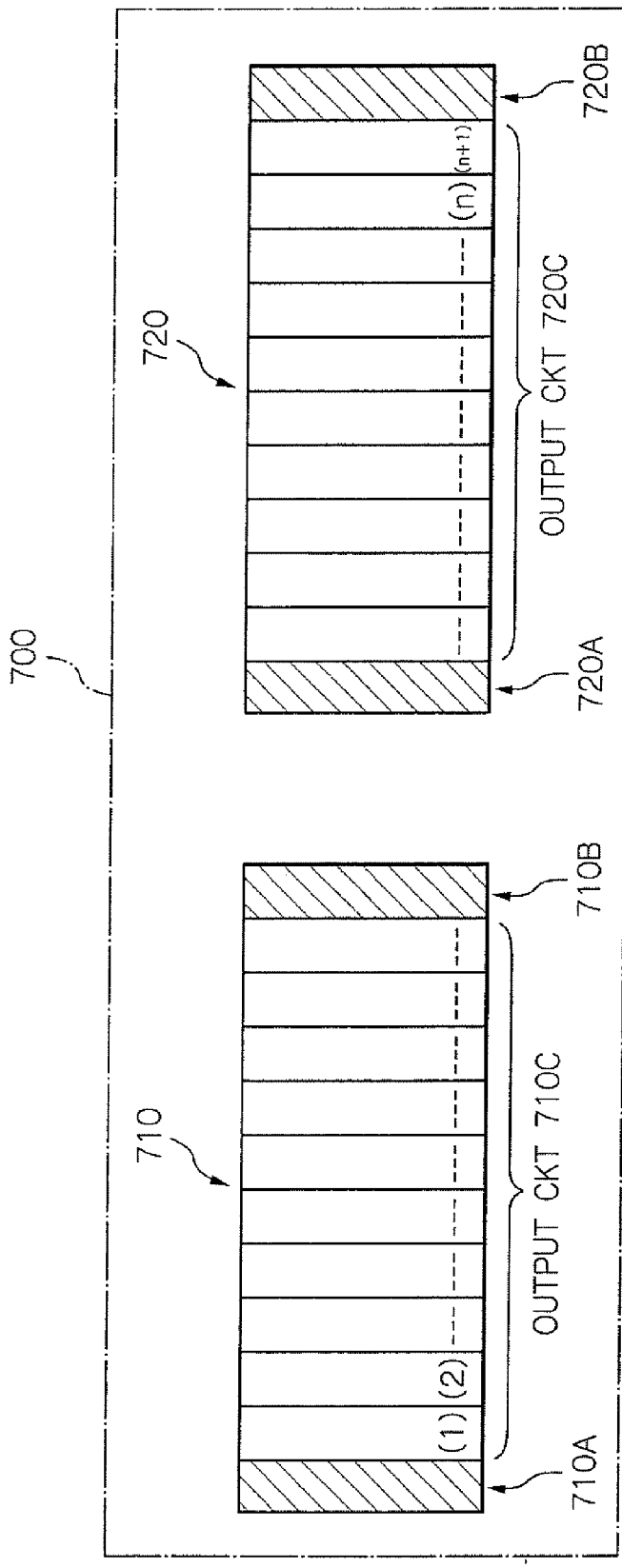

US 8,139,053 B2

ARRANGEMENT FOR CANCELING OFFSET OF DRIVER AMPLIFIER CIRCUITRY

BACKGROUND OF THE INVENTION

1. Field of the Invention

The present invention relates to an arrangement for canceling offset of driver amplifier circuitry responsive to an input signal to produce a corresponding output signal.

2. Description of the Background Art

In order to suppress the offset involved in an operational amplifier, the conventional practice has been directed to increasing the area of the gate electrode of transistors constituting the operational amplifier so as to render the effect on its offset of variation in manufacturing process smaller.

As a solution of canceling the offset of an operational amplifier involved in canceling offset without increasing the gate area of transistors constituting the operational amplifier, an offset canceller has been proposed in, for example, U.S. Pat. No. 6,448,836 to Kokubun et al. The offset canceller is designed to cancel the offset in an amplifier to develop an output signal corresponding to an input signal.

In more detail, when a voltage is applied to the input terminal of an amplifier, the switching elements are changed over to cause a voltage involving offset to be stored in the capacitive element. The switching elements are then changed over to cause feedback such that the gate voltages of the operational amplifier will be of the same value, based on the voltage stored in the capacitive element, thereby canceling the offset of the operational amplifier.

However, in an operational amplifier circuit having its feedback elements, such as capacitive or resistive elements, for setting the amplification factor of the amplifier provided outside of the operational amplifier, it is necessary to correct the amplification factor in order to overcome the offset ascribable to the capacitance and resistance values. With the conventional offset canceller, however, it is difficult to deal with such a situation with ease.

Additionally, with the conventional offset canceller, it is not possible to output a signal during the offset canceling operation. Stated differently, the offset cancel mode needs to be set, thus affecting the operation efficiency.

SUMMARY OF THE INVENTION

It is an object of the present invention to provide driver amplifier circuitry which can cancel offset with ease, even in case a feedback element, such as capacitive and resistive elements, is connected in circuit outside of an operational amplifier per se, and simultaneously with producing an output signal.

In accordance with the present invention, there is provided an offset canceller for canceling the offset across a plurality of driver ICs driving a display apparatus wherein each of the driver ICs includes a plurality of output circuits provided more than a plurality of display data outputs, a reference voltage generator for generating a reference voltage, and a memory provided in each of said output circuits. In operation, one of the output circuits corresponding in number to the plurality of display device data outputs produces outputs corresponding to display data on the display apparatus. At least one of the remaining output circuits compares the outputs thereof with the reference voltage to store a value corresponding to an offset of the output circuit in the memory to cancel the offset of the output circuits sequentially. The reference voltage generator of each driver IC is connected via an output pad of each driver IC.

In accordance with the present invention, there is amplification circuitry for driving a display apparatus for use in the display apparatus with an offset canceled for the plurality of output circuits during operation. The output circuits are divided into N groups, N being a natural number, each group having a reference voltage generator generating a reference voltage for offset canceling. Ones of the plurality of groups are selected, and reference voltage outputs for offset canceling generated by the reference voltage generators of the selected groups are all short-circuited to be used as the reference voltage for the totality of the remaining output circuits.

In accordance with the present invention, there is also provided an IC chip including a plurality of output circuits for canceling an offset. The output circuits are grouped into N groups, for offset canceling, N being a natural number. An offset cancel reference voltage is generated for each of the groups, and one of the groups is selected. The reference voltage for offset canceling, generated by the group selected, is used as an offset cancel reference voltage for the remaining groups.

Further in accordance with the present invention, there is also provided an IC chip including a plurality of output circuits for canceling an offset, in which the output circuits are grouped into N groups, for offset canceling, N being a natural number. An offset cancel reference voltage is generated for each of the groups, and a plurality of the groups are selected. The reference voltages for offset canceling, generated by the groups selected, are short-circuited to be used as an offset cancel reference voltage for the remaining groups.

Still further in accordance with the present invention, there is further provided a driver IC for use in a plurality of driver ICs that drive a display apparatus. The driver IC comprises a plurality of output circuits provided more than the display data outputs, and a reference voltage generator for generating a reference voltage based on data for comparison. The driver IC also comprises memories each provided in one of the output circuits, a comparator for comparing an output of the output circuit with the reference voltage, and a switching circuit provided between the reference voltage generator and the comparator. The driver IC also comprises a connector pad for receiving a signal that controls the switching means, and another connector pad connected to a node interconnecting the switching circuit and the comparator. In operation, one of the output circuits corresponding in number to the display data outputs produces outputs corresponding to display data to the display apparatus. At least one of the remaining output circuits compares the outputs thereof with the reference voltage to store a value corresponding to an offset of the output circuit in the memory to sequentially cancel the offset of the output circuits.

In accordance with present invention, there can be provided an offset canceller, amplifier circuitry, an IC chip and a driver IC in which an offset of an operational amplifier may be canceled even in case capacitive or resistive element is connected outside of the operational amplifier per se, and in which signals may be output even during the offset canceling operation.

BRIEF DESCRIPTION OF THE DRAWINGS

The objects and features of the present invention will become more apparent from consideration of the following detailed description taken in conjunction with the accompanying drawings in which:

FIG. 7 is a schematic plan view of an example of the layout of an integrated circuit (IC) in accordance with the alternative embodiment shown in FIG. 5.

DESCRIPTION OF THE PREFERRED EMBODIMENTS

Figure 1:
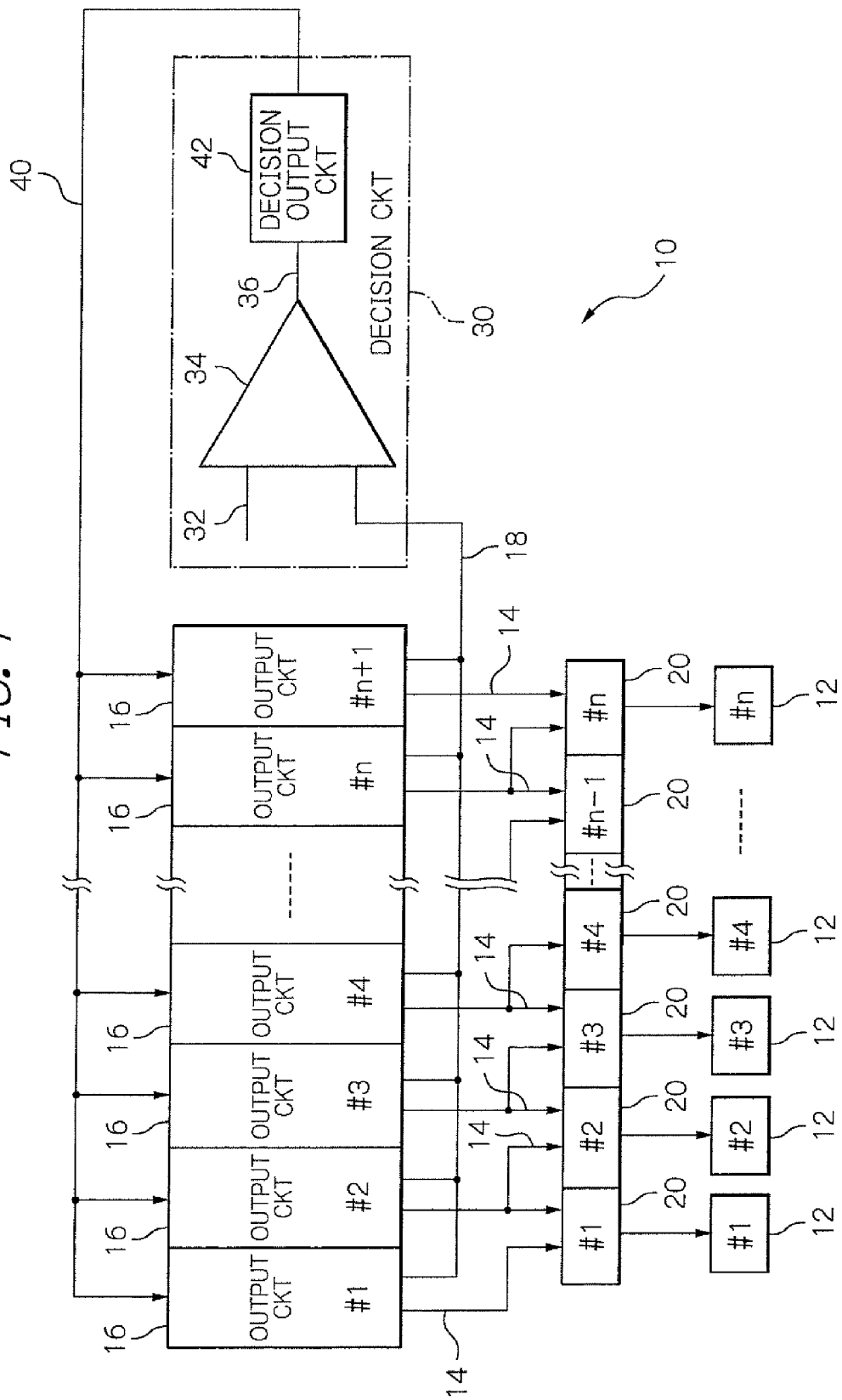
FIG. 1 is a schematic block diagram showing the basic constitution of an exemplified liquid crystal display (LCD) driver circuit to which the present invention is applicable.

FIG. 1 schematically depicts the basic configuration of a driver circuit 10 implemented as a liquid crystal display (LCD) driver circuit, to which the present invention is applicable. Specifically, FIG. 1 shows the basic constitution of the driver circuit 10 for driving an LCD device, not shown. The driver circuit 10 includes a plurality (n+1) of output circuits 16, which are fabricated in the form of integrated circuit (IC) for driving the LCD device and include a plurality of operational amplifiers, where n is a natural number.

The output circuits 16 are thus numbered as #1 to #n+1. The driver circuit 10 further includes a corresponding plurality (n) of output selectors 20, thus numbered as #1 to #n, and a corresponding plurality (n) of output terminals 12, thus numbered as #1 to #n. Furthermore, the driver circuit 10 includes a single decision circuit 30. Those components are interconnected as illustrated. The decision circuit 30 includes a comparator 34 and a decision output circuit 42, which are interconnected as depicted.

The output circuits 16 are provided more than the output selectors by one, but may be provided more by two or more. In the latter case, the output selectors 20 are adapted to select the output circuits 16 in a manner different from that described above. To the output terminals 12, connected are the LCD devices, or cells, of a liquid crystal display panel, for example. In FIG. 1, the input terminals of the output circuits 16 are not shown merely for simplicity, but in FIG. 2 as connections 200.

Figure 2:
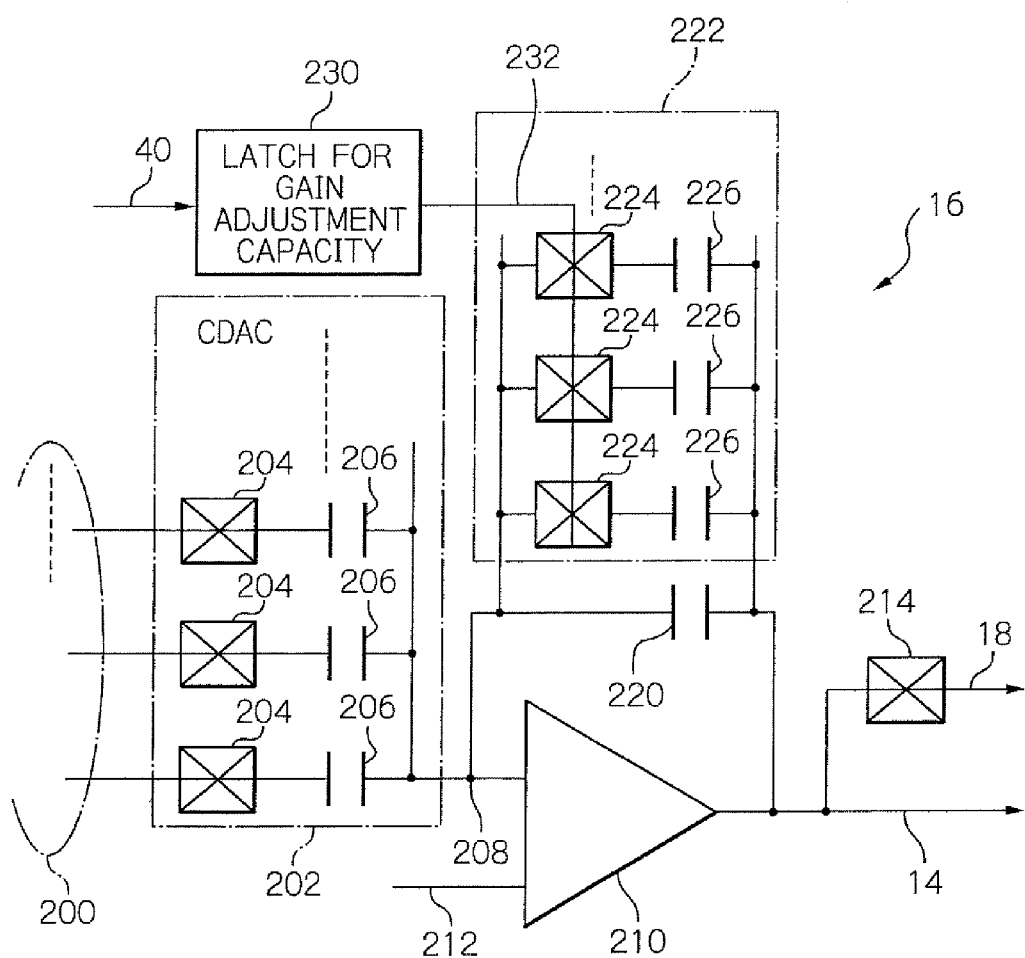
FIG. 2 is a schematic block circuit diagram showing the constitution of the output circuit in the driver circuit shown in FIG. 1.

Now, FIG. 2 shows an instance of the basic constitution of the output circuit 16 in the driver circuit 10. The output circuit 16 includes an operational amplifier 210, a capacitive element 220, a switch 214, a set of input terminals 200, a capacitance type of digital-to-analog converter (CDAC) 202, a capacitor circuit 222 and a latch for gain adjustment capacitor 230. The output circuits 16 may all be of the same constitution. The capacitive element 220 functions as a feedback element forming part of a feedback loop of the operational amplifier 210.

The digital-to-analog (D/A) converter 202 includes serial connections of a switch 204 and a capacitive element 206 which has its one plate interconnected in common to the one input 208 of the operational amplifier 210 as depicted in FIG. 2. The input signal line 208 is connected to receive an analog signal representing the output voltage from the output terminal 14 of the operational amplifier 210 over the feedback path including the capacitance 220. Signals are designated with reference numerals of connections on which they are conveyed.

The capacitor circuit 222 also includes serial connections of a switch 224 and a capacitive element 226, which are interconnected in parallel to each other as illustrated. The set of input terminals 200 is connected to receive input digital signals on a bit-by-bit basis.

The operational amplifier 210 has its input connected to the signal line 208 and its other input connected to another signal line 212. The operational amplifier 210 also has its single output connected to the signal line 14.

The capacitive element 220 has its one plate connected the signal line 14 representing the output of the operational amplifier 210. The capacitive circuit 220 has its other plate connected to the signal line 208, over which the output 14 of the operational amplifier 210 is fed back to the output port of the D/A converter 202 and the one input of the operational amplifier 210.

The latch for gain adjustment capacitor 230 includes a plurality of latch circuits, not shown, corresponding to the number of the switches 224. These latch circuits are adapted to output signals for controlling the conduction, i.e. on/off-condition, of the switches 224. These multiple latch circuits, enclosed within the latch for gain adjustment capacitor 230, are in one-for-one correspondence with the switches 224, and each latch circuit is connected to corresponding one of the switches 224. Hence, in actuality, the signal lines 232 are provided as many as the switches 224. The latch for gain adjustment capacitor 230 also includes a plurality of latch control circuits, also not shown, for controlling the on/off-condition of the latch circuits, enclosed within the latch for gain adjustment capacitor 230. By these latch control circuits, decision output signals, delivered over a signal line 40, are retained to control the multiple switches 224.

The operation of the output circuits 16 of the driver circuits 10 will now be described according to the basic configuration. Initially, the switch 214 in the output circuit #1, 16, is turned on, whilst the switches 214 in the other output circuits #2 to #n+1, 16, are all turned off.

The switch 214 is controlled in this manner by the latch control circuit enclosed within the latch for gain adjustment capacitor 230. It should be noticed that a memory, such as a latch, adapted to store therein control data, such as a value corresponding to the offset, is provided within the latch for gain adjustment capacitor 230.

The output selectors 20 connect the output circuit #2, 16, to the output terminal #1, 12, then connect the output circuit #3, 16, to the output terminal #2, 12, and so on, in a switching fashion, until the output selectors 20 connect the output circuit #n+1, 16, to the output terminal #n, 12.

In this connecting state, the output circuit #1, 16, undergoes the offset canceling operation. Specifically, the switches 224 in the capacitive circuit 222 are all set to the off state thereof by the latch for gain adjustment capacitor 230. In this state, the operational amplifier 210, the gain of which has been set by the capacitive element 220 serving as a feedback capacitor, delivers an output signal, which is in turn delivered over the signal line 18 via the switch 214 to the decision circuit 30, FIG. 1, and to the signal line 14.

The output signal, delivered to the decision circuit 30, is received by the comparator 34, FIG. 1. The comparator 34 compares the voltage of the output signal transferred over the signal line 18 with the reference voltage provided on the signal line 32 with each other, and delivers a resultant output signal representing a difference therebetween to the decision output circuit 42 over a signal line 36. The decision output circuit 42 delivers a decision output signal, indicating the result of decision, at a predetermined timing to the signal line 40.

The decision output signal, output from the decision circuit 30, is delivered to the respective output circuits 16, over the signal line 40. The output circuit #1, 16, which has received the decision output signal, stores the decision output signal, output from the decision circuit 30 and transferred on the signal line 40, in the memory of the latch for gain adjustment capacitor 230.

At this time, the latch for gain adjustment capacitor 230 causes one of the switches 224 of the capacitive circuit 222 to be turned on, i.e. conductive. In this state, the decision circuit 30 stores the decision output signal, output from the decision circuit 30, again in the memory of the latch for gain adjustment capacitor 230.

This sequence of operations will be repeated. More specifically, the latch for gain adjustment capacitor 230 causes the switches 224 of the capacitive circuit 222 to be turned on sequentially to add the capacitances 226 of the capacitive circuit 222 one-by-one.

Each time the capacitances are added in this manner, the decision circuit 30 compares the voltage appearing in the output signal transferred over the signal line 18 with the reference voltage supplied the signal line 32. The decision circuit then feeds back the result of comparison as a decision output signal to the output circuit 16, over the signal line 40, by way of the signal feedback operation. This sequence of operation is repeated.

When the voltage appearing in the output signal of the decision circuit 30, transferred over the signal line 18, has become lower than the reference voltage supplied over the signal line 32, the offset canceling operation for the output circuit #1, 16, comes to a close.

When the offset canceling operation for the output circuit #1, 16, has come to a close, the switch 224 of the output circuit #1, 16, is turned off, i.e. non-conductive, and the switch 224 of the output circuit #2, 16, then is turned on. The output selector #1, 20, is connected to the output circuit #2, 16, and the output terminal #1, 12. In this state of connection, the offset canceling operation for the output circuit #2, 16, is carried out as described above.

The offset canceling operation is carried out in this manner in each of the output circuits 16. When the offset canceling operation has been finished up to the output circuit #n+1, 16, the offset canceling operation for the output circuit 16 is again carried out.

The control of the latch circuit, the offset canceling operation and the offset canceling carried out by changing over the output circuits 16 is exercised by the latch control circuit of the latch for gain adjustment capacitor 230.

In case there are several output circuits 16 on which the offset canceling operation as described above has not yet been carried out at the timing, the D/A converters 202 of such output circuits 16, for which the offset canceling operation is not going on, convert the predetermined number of bits of the digital input signal, received on the set of the input terminals 200, to a corresponding analog signal 208. This analog signal 208 is then supplied to the one input of the operational amplifier 210 over the signal line 208. In parallel therewith, the input analog signal 208 is amplified against the reference voltage supplied to the other input of the operational amplifier 210 on the signal line 212 in accordance with the capacitance established on the capacitive element 220 and the capacitor circuit 222.

Figure 3:
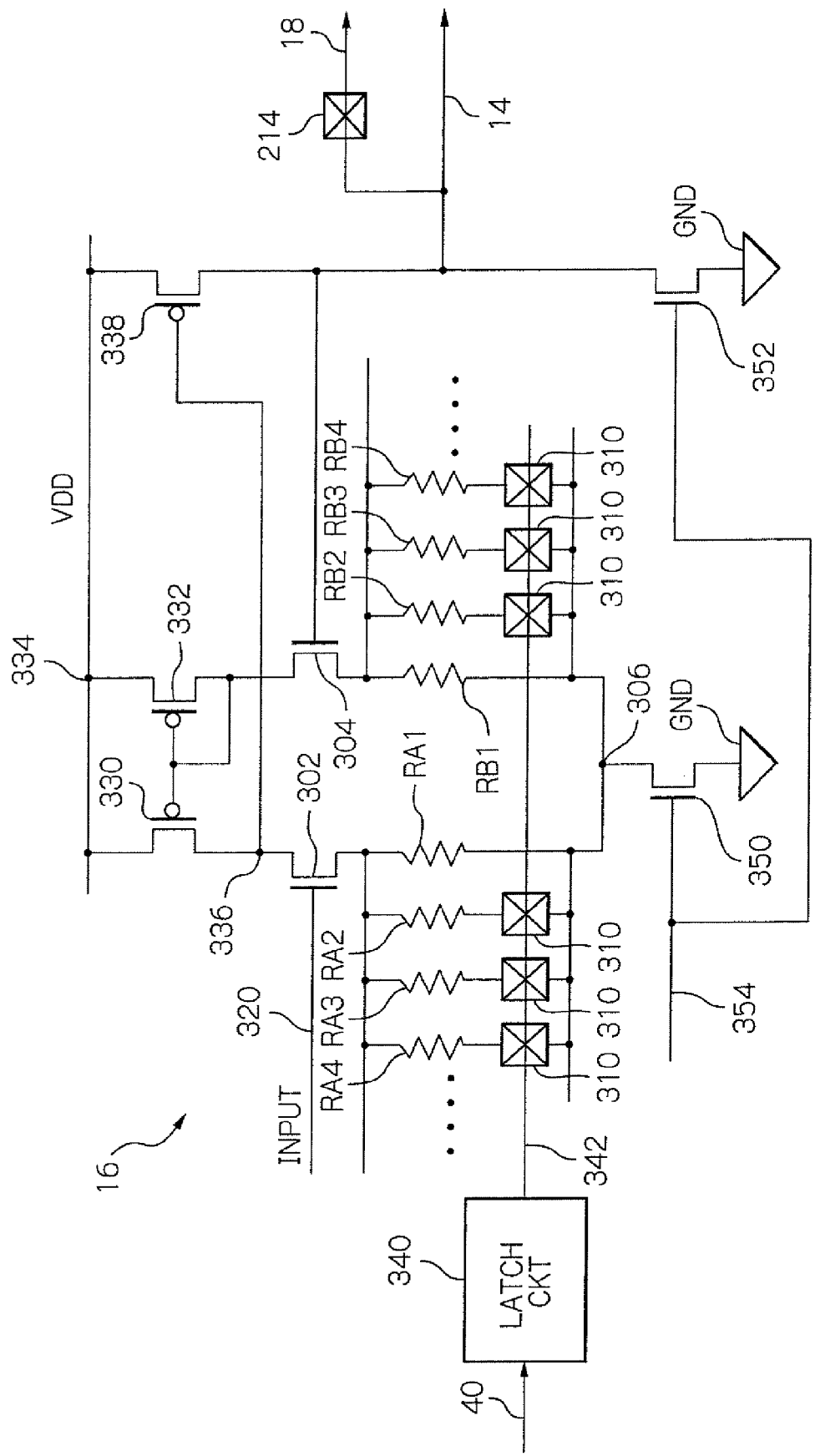
FIG. 3 is a schematic block circuit diagram showing a modification of the output circuit shown in FIG. 2.

FIG. 3 shows a modification of the output circuit 16, FIG. 2, provided in the driver circuits 10, FIG. 1. In the output circuit 16, there is formed an operational amplifier including an N-type field effect, or NMOS, transistor 302 and an N-type field effect transistor 304 together forming a differential transistor pair.

The output circuit 16 includes another operational amplifier including a P-type field effect, or PMOS, transistor 330 and a P-type field effect transistor 332. These two transistors are paired to together form a current mirror circuit.

The output circuit 16 also includes resistive elements RA1, RA2, R3A, R4A and so on, collectively termed RA system resistive elements, and resistive elements RB1, RB2, RB3, RB4 and so on, collectively termed RB system resistive elements. The output circuit 16 further includes switches 310, 214, and a latch circuit 340 which are interconnected as shown. It should be noticed that the resistive elements all serve as feedback elements, and the latch circuit 340 may be of the same constitution as the latch for gain adjustment capacitor 230, FIG. 2.

The output circuit 16 further includes another P-type field effect transistor 338, another N-type field effect transistor 350 and another N-type field effect transistor 352, which are interconnected as illustrated.

In the output circuit 16, the resistive element RA1 is connected between the NMOS transistor 302 and a node 306, and the resistive element RB1 is connected between the NMOS transistor 304 and the node 306.

Also, in the output circuit 16, there are connected, between the NMOS transistor 302 and the node 306, plural sets of the resistive elements RA2, RA3, RA4 and so on and the respective switches 310, serially connected to each other to form resistive element-switch sets, which are connected in parallel to one another. In a similar manner, there are connected, between the NMOS transistor 304 and the node 306, plural sets of the resistive elements RB2, RB3, RB4 and so on and the respective switches 310, serially connected to each other to form resistive element-switch sets, which are connected in parallel to one another.

In the output circuit 16, the NMOS transistors 302 and 304 have the drain electrode thereof connected to a connection 334 via P-type field effect transistors 330 and 332. Also in the output circuit 16, the NMOS transistor 302 and the PMOS transistor 330 are connected to a junction 336 and the gate electrode of a P-type field effect transistor 338.

In the output circuit 16, the PMOS transistor 338 has its drain electrode connected to the gate electrode of the NMOS transistor 304 and to the signal line 14 forming the output of the output circuit 16. The signal line 14 is connected to the switch 214, which has its other terminal 18 connected to the decision circuit 30 shown in FIG. 1.

Further, in the output circuit 16, the switches 310, connected to the resistive elements RA2, RA3, RA4 and so on and the resistive elements RB2, RB3, RB4 and so on, are connected to an output side of the latch circuit 340 by a signal line 342.

The operation of the output circuit 16 of the basic configuration shown in FIG. 3 will now be described. First, the internal switch 214 of the output circuit #1, 16, in the first stage is turned on, while the internal switches 214 of the output circuits #2 to #n+1, 16, are all turned off. Also, as in the basic configuration, the output selectors 20 connect the output circuit #2, 16, to the output terminal #1, 12, and so on until the output selectors connect the output circuit #n+1, 16, to the output terminal #1, 12, by way of switching the connections.

The switches 214 are controlled at this time by the latch control circuit enclosed within the latch circuit 340. The operation of the latch control circuit is similar to that of the latch control circuit of the basic configuration shown in FIG. 2. The latch circuit 340 also controls the on/off-condition of the switches 310 connected to the resistive elements RA2, RA3, RA4 and so on and the resistive elements RB2, RB3, RB4 and so on. In the latch circuit 340, as in the latch for gain adjustment capacitor 230, there is enclosed a memory to store data, such as control data.

A power supply voltage VDD is supplied to the connection line 334. The NMOS transistor 350, connected to the node 306, and the NMOS transistor 352, connected to the drain electrode of the PMOS transistor 338, have their gate electrodes supplied with the bias voltage over a signal line 354 to constitute a current source.

In this state, the offset canceling operation is carried out for the output circuit #1, 16. Specifically, the switches 310, connected to the restive devices RA2, RA3, RA4 and so on, are all turned on, while the switches 310, connected to the restive devices RB2, RB3, RB4 and so on, are all turned off.

In this state, the output circuit #1, 16, delivers an output signal. Specifically, the output circuit #1, 16, the gain of which has been set by the resistive element RB1, delivers the output signal.

The output circuit 16 maybe replaced by an operational amplifier, in which case the signal line 320 is equivalent to one of the inputs INPUT of the operational amplifier. The other input of the operational amplifier, representing the reference voltage, is supplied to the gate electrode of the NMOS transistor 304. An output signal of the operational amplifier is delivered over the signal line 14 or 18.

The restive devices RA2, RA3, RA4 and so on, to which the NMOS transistor 302 is connected, are connected in parallel with the resistive element RB1, to which the NMOS transistor 304 is connected. Hence, the combined resistance of the resistive devices RA2, RA3, RA4 and so on is smaller than the resistance of the resistive element RB1.

It should be noticed that, if the same current flows through the NMOS transistors 302 and 304, the voltage between the source electrode of the NMOS transistor 304 and the node 306 becomes larger than that between the source electrode of the NMOS transistor 302 and the node 306.

Thus, if the gate voltage of the NMOS transistor 302 is equal to that of the NMOS transistor 304, representing the offset-free state, the output voltage of the output circuit 16 is stabilized in a voltage state slightly higher than the input voltage to the signal line 320 representing the input (INPUT).

In this state, the output signal, delivered to the decision circuit 30, shown in FIG. 1, is delivered to the comparator 34. The comparator 34 compares the voltage appearing in an output signal supplied over the switch 214 and the signal line 18 with the reference voltage supplied on the signal line 32.

Further, the comparator 34 is responsive to the difference, resulting from the comparison, to deliver an output signal to the decision output circuit 42 over the signal line 36. If the voltage that appears as an output signal via the switch 214 and the signal line 18 is higher than the reference voltage supplied on the signal line 32, a decision output signal, representing the result of decision, is produced from the decision output circuit 42 at a predetermined timing on the signal line 40. The decision output signal, delivered over the signal line 40, is supplied to the respective output circuits 16. The memory of the latch circuit 340 of the output circuit #1, 16, holds the decision output signal delivered on the signal line 40.

The resistive element RA2 then is turned off to slightly lower the output voltage of the output circuits 16. In this state, the decision operation is carried out as described above. When the decision operation, with the resistive element RA2 off, has come to a close, the switches 310 connected to the resistive elements of the RA system are all turned off. After turning off the switches 310, connected to the resistive elements of the RA system, the resistive elements RB2, RB3 and so on of the RB system are sequentially turned on. During this time, the output voltage of the output circuit 16 is lowered progressively. If, with the offset voltage of the operational amplifier taken into account, the input voltage to the signal line 320, as the input (INPUT), is equal to the output voltage delivered from the signal line 14, the offset canceling operation for this output circuit #1, 16, comes to a close.

When the offset canceling operation for this output circuit #1, 16, has come to a close, its internal switch 214 is turned off, and the switch 214, provided within the next stage output circuit #2, 16, is turned on, by way of switching. It is noted that, when the offset canceling operation has come to a close, at this switching time, the internal switch 214 of the output circuit #1, 16, is turned off by the latch control circuit that controls the on/off-condition of the multiple latch circuits based on a stored value in the memory of the latch circuit 340 enclosed within the output circuit #1, 16. The latch control circuit of the latch circuit 340, provided in the next stage output circuit #2, 16, controls the operation of turning on the switch 214 provided within the next stage output circuit #2, 16. The latch control circuit controls the on/off-condition of the multiple latch circuits, based on a stored value in the memory of the latch circuit 340.

The switching operation by the output selectors 20 is carried out as in the illustrative embodiment described above to transfer the output of the output circuit #1, 16, to the output terminal #1, 12. The offset canceling operation is carried out in a similar manner in the next stage output circuit #2, 16, through to the output circuit #n+1, 16. When the offset canceling operation up to the output circuit #n+1, 16, has come to a close, the offset canceling operation will be repeated, beginning from the output circuit #1, 16.

The above control operation of the latch circuit operation and the offset canceling operation, and the sequential switching of the output circuits 16 to carry out the offset canceling is performed by the latch control circuit of the latch circuit 340.

Figure 4:
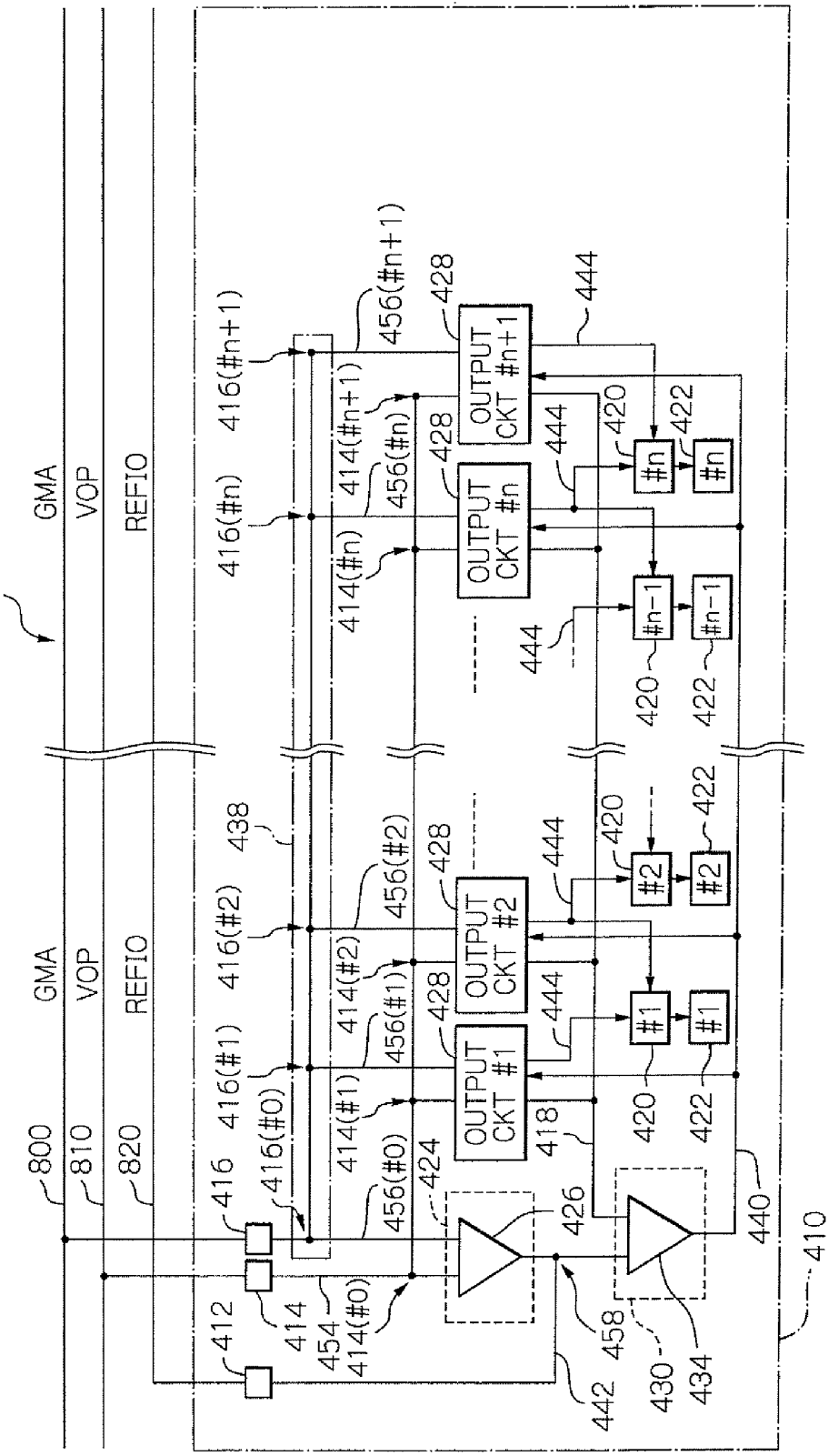
FIG. 4 is a schematic block circuit diagram showing the constitution of an illustrative embodiment of the driver circuit applicable to the liquid crystal display driver circuit shown in FIG. 1 in accordance with the present invention.

An example of the constitution of a driver circuit 400 of the illustrative embodiment is shown in FIG. 4. The driver circuit 400 is fabricated on a semiconductor substrate and comprised of an integrated circuit (IC) chip 410, one or more electronic components, not shown, and an IC chip or chips other than the integrated circuit 410.

The integrated circuit 410 includes three connector pads 412, 414 and 416, a signal divider 438 and a reference output circuit 424. The integrated circuit 410 also includes output circuits #1 to #n+1, 428, output selectors #1 to #n 420, output terminals #1 to #n, 422, and a decision circuit 430.

The reference output circuit 424 is made up of an operational amplifier 426 and feedback elements, constituted by the combinations of electric components, such as resistive or capacitive elements. The decision circuit 430 has enclosed therein a comparator 434. The output terminal 422 is a connector pad for outputting from the integrated circuit 410. The output circuits 428 may be of the same constitution as the output circuits 16 shown in FIG. 2 or 3.

To the signal divider 438, a signal line 800 is connected by the pad 416. The signal line 800 is connected via a node #0, 416, and a signal dividing line #0, 456, to the reference output circuit 424. The signal line 800, connected via the pad 416 to the signal divider 438, is connected via a node #1, 416, and a signal dividing line #1, 456, to the output circuit #1, 428, and so on until the signal line 800 is connected via a node #n+1, 416, and a signal dividing line #n+1, 456, to the output circuit #n+1, 428.

A signal line 810 is connected via the pad 414, another signal line 454 and a node #0, 414, to the reference output circuit 424. The signal line 810 is connected via the pad 414, another signal line 454 and a node #1, 414, to the output circuit #1, 428. The signal line 810 is connected in a similar manner until it is connected via the pad 414, the signal line 454 and a node #n+1, 414, to the output circuit #n+1, 428. To the pad 412, another signal line 820 is connected.

The reference output circuit 424 has its output port connected to the pad 412 via the node 458 and a signal line 442. The output port 458 of the reference output circuit 424 is also connected via the node 458 to the decision circuit 430.

The decision circuit 430 includes a comparator 434, which has its one input connected to a signal line 418 and its other input port connected to the signal line 442. The comparator 434 also has its output port connected via a signal line 440 to the multiple output circuits 428.

The output circuit 428 is connected via the signal line 418 to the decision circuit 430, and is also connected via a signal line 444 to the output selectors 420. The multiple output selectors 420 are connected respectively to the multiple output terminals 422.

The integrated circuit 410 is, for instance, for use in one of multiple driver ICs adapted for driving a display apparatus, such as LCD device.

The operation of the integrated circuit 410 of the driver circuit 400 of the illustrative embodiment will now be described, when taking a case where the output circuit 16 shown in FIG. 2 includes the output circuit 428 shown in FIG. 4.

In operation, a GMA signal is supplied from outside over the signal line 800 and is delivered via the pad 416 to the signal divider 438. An analog signal, matched to the reference output circuit 424, is delivered via the node #0, 416, and the signal dividing line #0, 456, to the reference output circuit 424. Meanwhile, the signal divider 438 divides the GMA signal, delivered via the pad 416, by resistive elements, and transfers the analog signals, matched to the output circuits #1 to #n+1, 428, via nodes #1, #2, 416, and so on and over the signal dividing lines #1, #2, 456, and so on to the output circuits.

A VOP signal is delivered in the form of d.c. reference signal from outside over the signal line 810 to the reference output circuit 424 via the pad 414 and the node #0, 414. The VOP signal, supplied via the pad 414, is then delivered via nodes #1, #2, 414, and so on to the respective output circuits #1, to #n+1, 428. It should be noticed that the VOP signal is a reference voltage for comparison which is in the order of 2.5V.

Thus, the reference output circuit 424 receives the GMA signal, which is supplied via the signal divider 438, and the VOP signal, which is the reference signal supplied from outside over the signal line 810 and the pad 414. The gain of the reference output circuit is determined by the enclosed operational amplifier 426, and an REFIO signal, representing the reference voltage for the offset canceling operation, is generated. In FIG. 4, the REFIO signal generated is one unit.

The REFIO signal, output from the reference output circuit 424, is delivered via the node 458 to the decision circuit 430. Simultaneously, the REFIO signal, delivered by the reference output circuit 424, is transferred to outside over the signal line 442 and the pad 412 on the signal line 820. It should be noticed that the REFIO signal may also be delivered as a reference signal for other ICs, for instance.

The output circuits 428 also receive the VOP signal and analog signals divided from the GMA signal. The operation inside the output circuits 428 may be the same as the output circuits 16 shown in FIG. 2.

One of the switches 214 within the multiple output circuits 428 is turned on, while the switches of the remaining output circuits 428 are turned off. At this time, the switch 214 is controlled by the memory and the latch control circuit enclosed within the latch for gain adjustment capacitor 230.

The output circuit 428 delivers an output signal to the output selector 420 over the signal line 444. Simultaneously, the output circuit 428 delivers the output signal to the decision circuit 430 over the signal line 418.

The output selector 420 selects one of the output signals, transferred over the signal line 444, from two neighboring output circuits 428. The signal selected by the output selector 420, is transferred to the output terminal 422 associated with the output selector 420.

The decision circuit 430 transfers, by way of signal feedback, a decision output signal, indicating the result of comparison by the comparator 434, over the signal line 440 to the output circuits 428.

Specifically, the comparator 434 compares the output signal, delivered by the output circuit 428 over the signal line 418, with the reference voltage delivered over the signal line 442, to generate a decision output signal indicating the result of comparison (output voltage). The comparator transfers the decision output signal to the multiple output circuits 428 over the signal line 440 at a predetermined timing. Such signal feedback is made possible by a feedback circuit in which the decision output signal as the decision result is fed back to the multiple output circuits 428 and an output signal is again delivered from each output circuit 428 over the signal line 418 based on the decision output signal.

In this state, the offset canceling operation is carried out for one of the multiple output circuits 428. When the offset canceling operation has come to a close, that is, when the offset cancel has been carried out until the offset cancel up to the output circuit #n+1, 428, in the multiple output circuits 428 is finished, the offset canceling operation by the output circuits 428 will again be repeated.

If there are several output circuits 428 that are at a timing the above offset canceling operation is not being carried out, the operations similar to those performed in the output circuit 16 shown in FIG. 2 will be carried out.

Hence, even if the feedback elements, such as capacitive or resistive elements, are provided in circuit outside the amplifier per se, the offset can be canceled with ease. Moreover, the offset canceling operation may be carried out simultaneously with the routine signal outputting operation. Specifically, with the driver circuit 400, it is possible to sequentially carry out the offset canceling operations as the multiple output circuits 428 carry out the routine outputting operations, for example, as the LCD driving signals are being output. Further, finer steps of the units of the capacitive elements 226 for gain adjustment may be employed so as to improve the precision in offset canceling to provide more uniform output voltages on the output terminals 422 in their entirety.

It is moreover possible to remove the difference in the average output offset of the operational amplifiers enclosed in the multiple output circuits 428. Since the offset cancel for the operational amplifiers enclosed in all of the output circuits 428 is achieved by using the reference voltage REFIO signal, output from the reference output circuit 424, there is generated no relative offset between the multiple output circuits 428.

There may be cases where there is limitation to the range of possible offset correction, so that, if the reference voltage output by the reference output circuit 424 is severely deflected as compared with the output voltage of the operational amplifier enclosed in the output circuit 428, the possible correction range is surpassed, with the result that the offset of the operational amplifiers of the output circuits 428 may not be canceled. This deficiency may be overcome with the present invention. Since the multiple output circuits 428 and the operational amplifier enclosed in the reference output circuit 424 are manufactured by the same process and are of the same configuration, the same output voltage maybe expected. Hence, there is no failure in the offset canceling operation ascribable to excursions in the reference voltage output by the reference output circuit 424.

In the illustrative embodiment, the multiple output circuits 428 may be provide more than the multiple output selectors 420 only by one, but may by two or more.

As the output circuit 428 shown in FIG. 4, the output circuit 16 shown in FIG. 3 may be used. In the latter case, as with the case of using the output circuit 16 shown in FIG. 2, what was stated in connection with the output circuit 16 shown in FIG. 2 may also be applied instead of what was stated in connection with the output circuit 16 shown in FIG. 3.

Thus, if the feedback elements, such as the capacitive or resistive elements, are provided in circuit outside the amplifier per se, the offset can be canceled with ease, while the routine signal outputting operation may be carried out simultaneously with the offset canceling operation.

The voltage follower type of offset, used in an LCD driver, for example, may be canceled without using capacitive elements. By using the comparator 434 of higher precision, and setting finer steps of the units of resistive elements of the RA or RB system, the offset canceling operation may be improved in accuracy. In addition, the offset canceling operation of the present invention may be carried out during the signal amplification operation.

It is also possible to eliminate the difference in average output offset of the operational amplifiers enclosed in the multiple output circuits 428.

There would be cases where there is limitation to the range of possible correction of offset, so that, if the reference voltage output by the reference output circuit 424 is severely deflected from the output voltage of the operational amplifier enclosed in the output circuit 428, the possible range of correction may be surpassed, thus disabling the offset of the operational amplifiers of the output circuits 428. This deficiency may however be overcome with the present invention.

Figure 5:
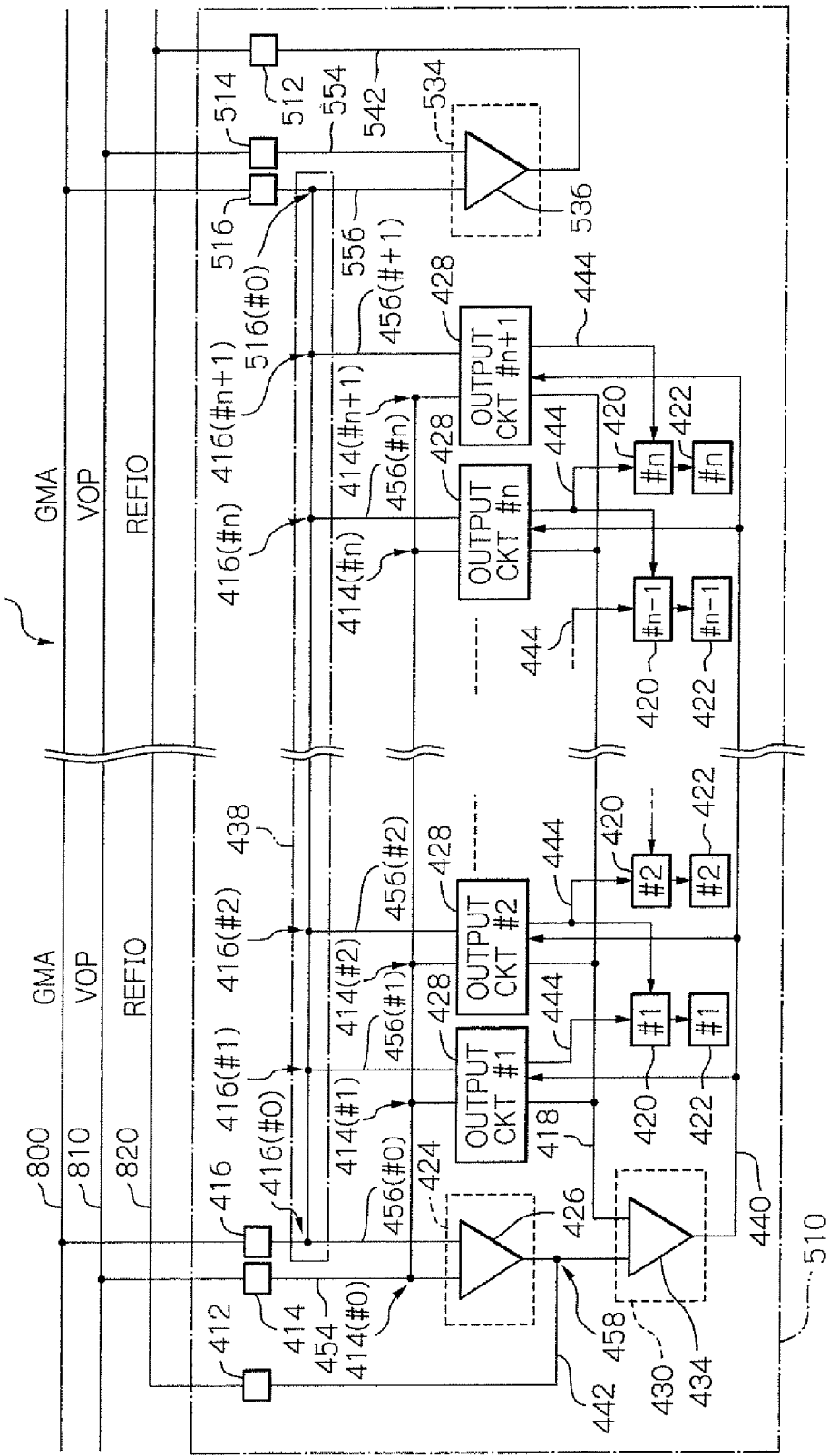
FIG. 5 is a schematic block circuit diagram, like FIG. 4, showing the constitution of an alternative embodiment of the driver circuit applicable to the liquid crystal display driver circuit shown in FIG. 1 in accordance with the invention.

The exemplified constitution of an alternative embodiment of driver circuit 500 is shown in FIG. 5. The driver circuit 500 is mounted on a semiconductor substrate, and is made up of an IC chip 510, one or more electric components, not shown, and an IC chip or chips, also not shown, other than the IC chip 410.

The IC chip 510 includes, in addition to the IC chip 410 shown in FIG. 4, connector pads 512, 514 and 516, and a reference output circuit 534.

The reference output circuit 534 added has the same constitution as the reference output circuit 424, and includes an operational amplifier 536 with feedback elements constituted by the combination of electric components, such as resistive or capacitive elements.

The connections of the components in the alternative embodiment shown in FIG. 5 may be the same as the illustrative embodiment shown in and described with reference to FIG. 4. However, there are added connections for the pads 512, 514 and 516 and the reference output circuit 534.

The connections added will now be described. The signal line 800 is connected to the pad 516, which is connected to the reference output circuit 534 via the signal divider 438, passing through the node #0, 516, and a signal dividing line 556.

The signal line 810 is connected to the pad 514, which is connected via a signal line 554 to the reference output circuit 534.

To an input of the operational amplifier 536 of the reference output circuit 534, there are connected the signal dividing line 556 and the signal line 554. To the output port of the operational amplifier 536 of the reference output circuit 534, there is connected a signal line 542, which is connected to the pad 512. The pad 512 is, in turn, connected to the signal line 820. The above are the connections added in the alternative embodiment as a result of addition of the reference output circuit 534.

Like the integrated circuit 410, the IC chip 510 is one of the multiple driving ICs for driving the display apparatus, such as an LCD device.

The operation of the integrated circuit 510 of the driver circuit 500 of the present alternative embodiment will now be described in terms of the case in which the output circuit 16 shown in FIG. 2 is used as the output circuit 428.

The present alternative embodiment may be the same as the embodiment described earlier except that an REFIO signal, which is a reference output signal for offset canceling and output from the reference output circuit 424, is also output from the reference output circuit 534, and that the reference output circuit 534 is provided on the opposite side to the reference output circuit on the integrated circuit 510.

The GMA signal, transferred over the signal line 800, is voltage-divided by resistive elements of the signal divider 438, in meeting with the reference output circuit 534 or with the reference output circuit 424. The resulting analog signal is output from the node #0, 516, of the signal divider 438. The analog signal is delivered to the reference output circuit 534 via the node #0, 516, of the signal divider 438 over the signal dividing line 556. The VOP signal, which is a reference signal from outside, is also delivered to the reference output circuit over the signal line 810 and the pad 514. The gain is set by the enclosed operational amplifier 536, and an REFIO signal is generated which represents the reference voltage for offset cancel.

The REFIO signals, delivered by the reference output circuits 424 and 534 are coupled, i.e. short-circuited, by the signal line 820. In the case shown in FIG. 5, the REFIO signal is shown as one unit, whereas multiple units of REFIO signal co-exist and coupled together in a short-circuited state.

Hence, the REFIO signals output from the reference output circuits 424 and 534 are free from difference in signal characteristics otherwise produced due to separation from each other by a certain distance, thus enabling the stabilized reference signal to be supplied to the output circuits 428.

That is, it becomes possible to eliminate the difference in characteristics otherwise caused by error in manufacture process of the integrated circuit 510 as a result of being separated on the integrated circuit 510.

FIG. 7 shows the configuration of a layout 700 of the integrated circuit 510 of the alternative embodiment. Specifically, FIG. 7 shows details of the layout 700 when the integrated circuit 510 according to the alternative embodiment shown in FIG. 5 is actually fabricated. The layout shown is an example of the operational amplifier which may become the practical reference.

The layout 700 is made up of output circuit cell units 710 and 720, each of which is an assembly of plural output circuit cells. The output circuit cell unit 710 is made up of reference output circuit cells 710A and 710B and multiple output circuit cells 710C. The output circuit cell unit 720 is made up of reference output circuit cells 720A and 720B and multiple output circuit cells 720C.

When the integrated circuits are actually fabricated, the cells are arrayed in parallel to one another, as shown in FIG. 7. Although respective wiring connections are not shown, the aluminum or copper wiring is arranged inside and outside of the cells for interconnecting the cells.

In the layout 700, multiple output circuit cells 710C are provided sandwiched between the reference output circuit cells 710A and 710B and, in a similar manner, multiple output circuit cells 720C are provided sandwiched between the reference output circuit cells 720A and 720B.

However, such a configuration is also possible in which the reference output circuit cells 710B and 720A are not provided, and the output circuit cells 710C and 720C are interconnected at a mid part of the layout 700 and arranged in parallel with one another, as the cells are sandwiched in their entirety by the reference output circuit cells 710A and 710B.

It is assumed that there are 720 channels of the output circuits 428 in the integrated circuit chip 510 shown in FIG. 5. In this case, the output circuit cells 710C represent an assembly of output circuit cells corresponding to the plurality of output circuits #1 to #360, 428, the reference output circuit cell unit 710A represents the reference output circuit 424, and the reference output circuit cell unit 710B represents a reference output circuit paired to the reference output circuit 424. Also, the output circuit cells 720C represent an assembly of output circuit cells corresponding to the plurality of output circuits #361 to #720, 428, the reference output circuit cell unit 720A represents the reference output circuit 534 and the reference output circuit cell unit 720B represents a reference output circuit paired to the reference output circuit 534. The output lines of the reference output circuit cells 710A, 710B, 720A and 720B are interconnected to form a common signal line, such as to provide for signal shorting, and are arranged on the sides of the output circuit cells 710C and 720C that receive the reference signals.

By arranging the reference output circuit cells 710A, 710B, 720A and 720B as well as the output circuit cells 710C and 720C as described above, it is possible to provide the shortest connection to suppress changes in distance-related characteristics to a minimum.

In addition, the outputs of the reference output circuit cells 710A, 710B, 720A and 720B are coupled together in a short-circuited fashion to remove distance-related changes in characteristics. Since the outputs of the reference output circuit cells 710A, 710B, 720A and 720B are arranged on the sides of the output circuit cells 710C and 720C that receive the reference signals, it is possible to relatively cancel the offset of the output circuit cells 710C and 720C.

It is also possible to reduce the size of the IC chip and to arrange the cells of the same constitution side-by-side, thereby suppressing variations in characteristics otherwise caused by distance-related factors other than those caused by offset.

A plurality of reference output circuits, such as the reference output circuits 534, and the pads 512, 514 and 516 may also be provided separately.

Figure 6:
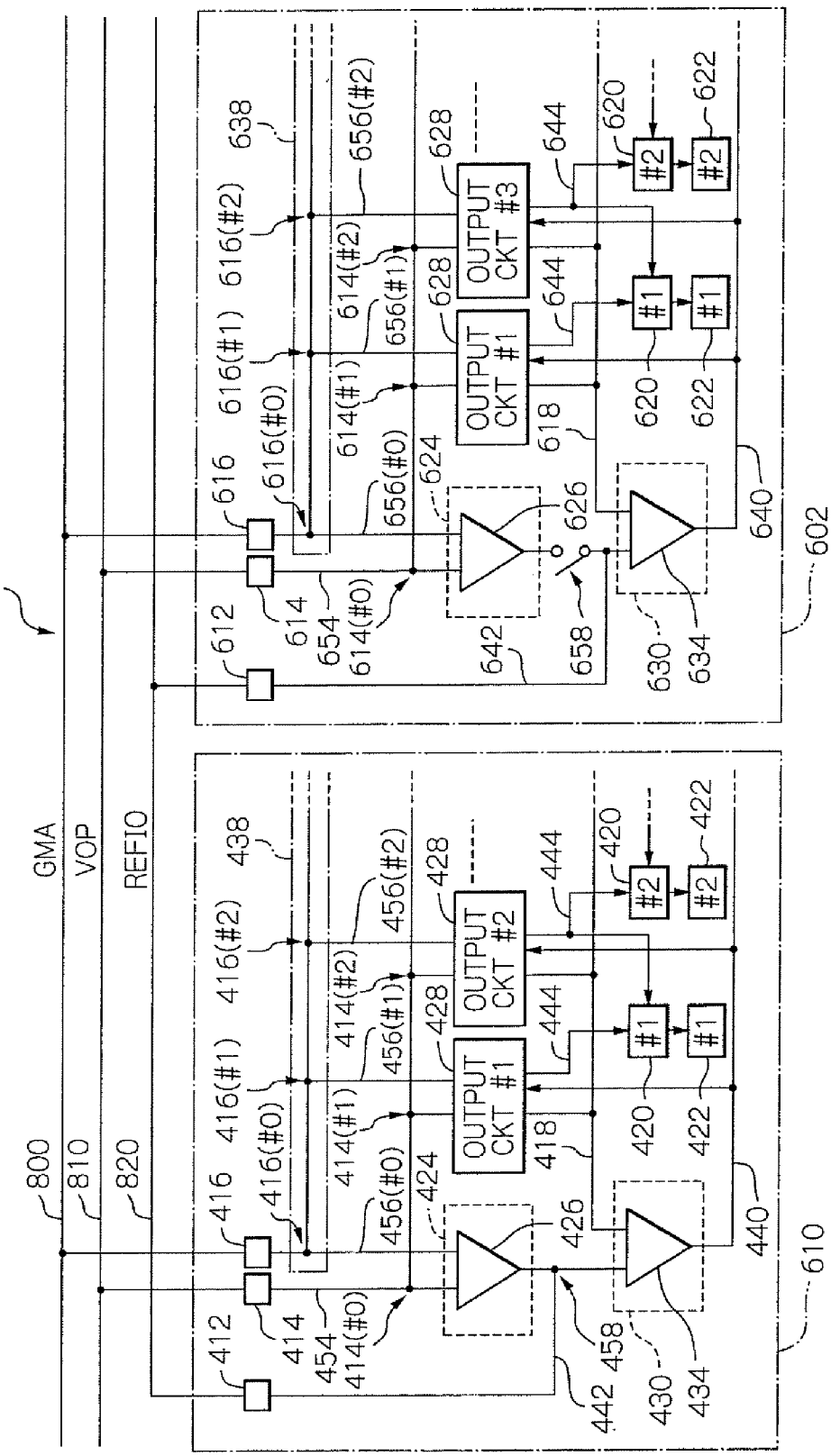
FIG. 6 is a schematic block circuit, like FIG. 4, diagram showing the constitution of a further alternative embodiment of the driver circuit applicable to the liquid crystal display driver circuit shown in FIG. 1 in accordance with the invention.

An example of the constitution of a driver circuit 600 according to a further alternative embodiment of the present invention is shown in FIG. 6. The driver circuit 600 is made up of integrated circuits 610 and 602. The integrated circuit 610 may be identical in constitution with the integrated circuit 400. Meanwhile, the integrated circuit 610 may also be identical with the integrated circuit 510.

The integrated circuit chip 602 is basically identical in constitution with the integrated circuit 610 or 410. However, a switch 658 is interposed between the parts equivalent to the node 458 and the reference output circuit 424 of the integrated circuit 610. This switch 658 is of a normally-off type. In other words, the integrated circuit 610 includes a switch, not shown, similar to the switch 658 and connected to be normally on. It should be noticed that, in FIG. 6, there are provided a plurality of IC chips with each IC chip as a unit.

Specifically, the IC chip 602 includes pads 612, 614 and 616, a signal divider 638 and a reference output circuit 624. The IC chip 602 also includes output circuits #1 to #n+1, 628, output selectors #1 to #n, 620, and output terminals #1 to #n, 622. The IC chip further includes the switch 658 and a decision circuit 630.

The reference output circuit 624 includes an operational amplifier 626, and the decision circuit 630 includes a comparator 634. The output circuits 628 may be identical with the output circuits 16 shown in FIG. 2 or 3. Specifically, the output circuits 628 shown in FIG. 6 represent an IC chip version of the output circuits 16 shown in FIG. 2 or 3 and hence are small-sized or miniaturized, as in the case shown in FIGS. 4 and 5.

The output selectors 620 may also be identical in constitution with the output selectors 20 shown in FIG. 1. Specifically, the output selectors 620 shown in FIG. 6 represent an IC chip version of the output selectors 20 shown in FIG. 1 and hence are small-sized or miniaturized. The output terminals 622 may also be identical with the output terminals 12 shown in FIG. 1. Specifically, the output terminals 622 shown in FIG. 6 represent an IC chip version of the output terminals 12 shown in FIG. 1 and are formed as pads that are small-sized or miniaturized. The decision circuit 630 may also be identical with the decision circuit 30 shown in FIG. 1. Specifically, the decision circuit 630 shown in FIG. 6 represents an IC chip version of the decision circuit 30 shown in FIG. 1 and hence is small-sized or miniaturized.

The signal line 800 is connected via the pad 616 to the signal divider 638. The signal line 800, connected via the pad 616 to the signal divider 638, is connected via a node #0, 616, and signal dividing line #0, 656, to the reference output circuit 624. In a like manner, the signal line 800, connected via the pad 616 to the signal divider 638, is connected via nodes #1, #2, 616, and so on and the signal dividing lines #1, #2, 656, and so on to the output circuits #1, #2, 628 and so on.

The signal line 810 is connected via the pad 614, a signal line 654 and anode 614#0, to the reference output circuit 624. In a like manner, the signal line 810 is connected, via the pad 614, signal line 654 and nodes #1, #2, 614, and so on to the output circuits #1, #2, 628, and so on.

The reference output circuit 624 has its output connected to the normally-open switch 658. The reference output circuit 624 has its output connected via the switch 658 to the decision circuit 630. The decision circuit 630 has its one input connected via the signal line 820, a pad 612 and a signal line 642 to the signal line 820.

In the decision circuit 630, the signal lines 642 and 618 are connected to an input of the comparator 634, which has its output connected via a signal line 640 to the multiple output circuits 628.

The output circuits 628 are connected via signal lines 644 to the output selectors 620, while being connected via the signal line 618 to the other input of the decision circuit 630. The signal line 618, derived from the respective output circuits 628, forms a sole common signal line, such as to provide for signal shorting.

Specifically, the output circuit #1, 628, is connected via the signal line 644 to the output selector #1, 620, whilst the output circuit #n+1, 628, is connected via the signal line 644 to the output selector #n, 620. The output circuits #2, to #n, 628, are connected via the signal line 644 to two neighboring ones 620 of the output selectors #1 to #n, 620.

The output selectors 620 are connected in one-for-one correspondence to the output terminals 622. The integrated circuits 610 and 602 are driver IC chips for driving the display apparatus.

The operation of the integrated circuits 610 and 602 of the present alternative embodiment shown in FIG. 6 will now be described. The operation of the integrated circuit 610 may be similar to that of the integrated circuit 410 or 510 shown in FIG. 1 or 5, respectively. However, the integrated circuit 610 includes a normally-on switch similar to the switch 658. It should be noticed that the integrated circuit 610 includes another connector pad, not shown, supplied with a signal controlling the normally-on switch. From this connector pad, there is supplied a signal controlling the switch to the normally-on state.

The operation of the integrated circuit 602 is basically similar to the operation of the integrated circuit 410 or 510 shown in FIG. 4 or 5, respectively. However, a normally-open switch 658 is provided between the reference output circuit 624 and the decision circuit 630. Since the circuit connection is interrupted in this manner, the signal generated by the reference output circuit 624 is not transferred to the decision circuit 630.

This switch 658 is so controlled to be turned on, when it is installed in the integrated circuit chip on the initial stage, for example, the integrated circuit 610, and to be turned off, when installed on the second and the following stages, for example, the integrated circuit 602.

The VOP signal, supplied from outside, is supplied to the integrated circuit 602, in the same manner as the signal divider 438 shown in FIGS. 4, 5 and 6. Specifically, the VOP signal is supplied via the pad 614 and the nodes #0, #1, #2, 614, and soon to the reference output circuit 624 and the multiple output circuits 628.

The signal divider 638 operate in a similar manner to the signal divider 438 shown in FIGS. 4, 5 or 6, and divides plural GMA signals, supplied via the pad 616 and the nodes #0, #1, #2, 616 and so on by resistive elements, not shown. The analog signals, obtained on division for the reference output circuit 624 and the multiple output circuits 628, are delivered to the reference output circuit 624 and to the respective output circuits 628.

The REFIO signal, generated by the reference output circuit 424 of the integrated circuit 610, is delivered via the node 458, the signal line 442, the integrated circuit 610 and the signal line 820. It may be said that the REFIO signal is output via the pad 412 connected to the node 458 interconnecting the switch, not shown, and the decision circuit 430.

In the integrated circuit 610, there is no switch, such as the switch 658 of the integrated circuit 602, between the reference output circuit 424 and the decision circuit 430, and the reference output circuit 424 is connected to the decision circuit 430 via the signal line 442 and the node 458. Hence, the REFIO signal, generated by the reference output circuit 424, is directly delivered to the reference signal receiving port of the decision circuit 430.

The REFIO signal, generated by the integrated circuit 610, is delivered via the pad 612 and the signal line 642 directly to the input port of the decision circuit 630, that is, to the reference signal receiving port of the decision circuit 630 of the integrated circuit 602.

The REFIO signal, generated by the reference output circuit 424, may be coupled to the REFIO signal generated by the reference output circuit 534 shown in FIG. 5, in a short-circuited fashion. The switch 658 may be a diode connected to prevent signal entrance, or may be in fully-opened state without wiring connection.

The decision circuit 630 transfers, by way of signal feedback, a decision output signal, indicating the result of comparison by the comparator 634, over the signal line 640 to the output circuits 628.

Specifically, the comparator 634 compares a signal, received by the output circuits 628 over the signal line 618, with the reference voltage, received over the signal line 642, to generate a decision output signal indicative of the result of comparison. The comparator 634 transfers the decision output signal to the multiple output circuits 628 over the signal line 640 at a predetermined timing. Thus, there is formed a feedback circuit in which the decision output signal, indicative of the result of comparison, is fed back to the multiple output circuits 628, which then deliver output signals again from the output circuits 628 over the signal line 618.

There is provided the sole IC chip that generates the REFIO signal. This REFIO signal, thus generated by the sole IC chip, is used in common by the other multiple IC chips. It is now assumed that the driver circuit 600 has twenty IC chips, including the IC chips 610 and 602, and is arranged as an LCD driver circuit. In such a case, the REFIO signal, generated by the IC chip 610, is used by the remaining nineteen IC chips as the REFIO signal for the comparators of the respective IC chips. In the illustrated case, in which only two IC chips are shown, the REFIO signal, generated by the integrated circuit 610, is used as the REFIO signal (reference signal) of the comparator 634 of the decision circuit 630 of the integrated circuit 602.

The output selector 620 selects one of two output signals transferred over the signal lines 644 from two neighboring output circuits 628. The output signals, selected by the output selectors 620, are transferred to the output terminals 622, associated in one-for-one relationship with the output selectors 620. Each output selector 620 also receives the output signal, transferred over the signal line 644 from each output circuit 628.

In operation, the output circuits 428 and 628, which are to output display data for the display apparatus, deliver output data corresponding to the display data to the display apparatus. At least one of the remaining output circuits 428 or at least one of the remaining output circuits 628 compares its output with the reference voltage to store a voltage value corresponding to the offset of the output circuit in the memory enclosed in the output circuit. This operation is sequentially carried out to cancel the offset of the output circuits.

It should be noted that the output circuit 628 may be provided more than the output selectors 620 by two or more, in which case the output selectors 620 may select associated output circuits 628 in variable different ways. The multiple output terminals 622 function as the connector pads of the integrated circuit 410 and are connected to, for example, a liquid crystal display panel. For cost reduction and for assuring ease in manufacture and designing, the integrated circuit chips are of the same constitution and manufactured by the same process. A plurality of reference output signals may be generated by the sole integrated circuit chip, as shown in FIG. 5.

The operation of the integrated circuit 610 may be described in the following simplified manner. During the outputting period, the reference amplifier, not shown, generates an REFIO signal, responsive to the VOP signal and the GMA signal, in the form of d.c. voltage signals.

Initially, the output circuit #1, 428, is delivered to the comparator 434 of the decision circuit 430 and compared with the REFIO signal for giving a decision. The output circuit #1, 428, may be termed channel #1, the output circuit #2, 428, may be termed channel #2 and so on. The output of channel #1 is adjusted, based on the result of comparison and again compared with the REFIO signal by the comparator to give the decision. This sequence of operation is repeated until the offset of channel #1 is equal to zero. The outputs of channel #2, #3 and so on are adjusted in a similar manner. The REFIO signal, generated by the integrated circuit 610, is directly supplied to the respective comparators of the IC chips other than the integrated circuit 610, to cancel the offset.

In an LCD display driver, employing multiple chips simultaneously, the difference in the output offset from chip to chip represents crucial factors. Hence, the output offset is canceled accordingly.

With the two illustrative embodiments described earlier, the output offset is canceled using the same REFIO signal as the reference output signal in one chip or in the totality of the chips. There is thus generated no output offset (relative offset) from chip to chip.

The operational amplifier 426 of the reference output circuit 424, which may be an operational amplifier, may be of the same constitution as the operational amplifier of the output circuit 428, which may also an operational amplifier, in which case the offsets of the output operational amplifier and the reference operational amplifier may be expected to be canceled to output the same output voltage. As a result, there is caused no failure in the offset cancel function ascribable to excursions of a voltage signal as a reference signal.

The reference output circuits 424 and 534, each including such a reference operational amplifier, may be provided on either side of the multiple output circuits 428, as shown in FIG. 5, in which case the locality-dependent offset of the IC chip may be canceled on its left and right sides.

At least the output signal of the operational amplifier 426 of the reference output circuit 424 and/or the output signal of the operational amplifier 536 of the reference output circuit 534 shown in FIG. 5 is coupled together in a short-circuited fashion, whereby it is possible to reduce the offset of at least the operational amplifier 426 of the reference output circuit 424 or the operational amplifier 536 of the reference output circuit 534 to assure sufficient drivability, i.e. driving performance.

As a result, the output voltage accuracy is determined by the reference voltage output from at least one of the operational amplifiers 426 and 536 of the reference output circuits 424 and 534, respectively, shown in FIG. 5. The difference in the potential of the reference voltage from chip to chip thus is not directly output as the difference in the average output offset from chip to chip. In simplified expression, it is possible to suppress variations or errors in the output voltages otherwise caused by manufacture tolerances of the reference voltage chips, that is, the relative offset.

It may sometimes occur that there is certain limitation to the range of possible offset correction, so that, if the reference voltage, output from one of the operational amplifiers 426 and 536 of the reference output circuits 424 and 534, respectively, shown in FIG. 5, is deviated appreciably from the normal value of the operational amplifier 426 or 536, the threshold value of the range of possible correction is surpassed. In such a case, the offset from one IC chip to another may remain uncanceled.

It is possible with the present invention to suppress output voltage excursions or variations other than the offset, for assuring reproducible manufacture, as shown in FIG. 7, thereby assuring reduction in cost and ease in manufacture and designing.

By using a reference voltage common to the respective IC chips, the reference voltage may be supplied from one or more reference voltage source of one semiconductor chip to the other chips. That is, the offset may be reliably canceled by using the unified, i.e. identified, reference voltage.

If at least one of the operational amplifier 426 and 536 of the reference output circuit 424 and 534, respectively, shown in FIG. 5 is used, and its output is coupled in a short-circuited fashion, it is possible to cancel the difference in characteristics in both the inside and outside of the IC chip.

In the operational amplifier as the reference shown in FIG. 6, only the IC chip 610 is in operation. It is however also possible to run the totality of the operational amplifiers, acting as the references of the IC chips, and to connect the outputs thereof for use as a reference signal for offset canceling operations. Alternatively, a few of the IC chips, including the integrated circuit 610, provided with the reference operational amplifier, may be picked up and run in operation, and the outputs thereof are coupled in a short-circuited fashion for use in the offset canceling operations. The normally-off switch 658 of the IC chip, such as provided in the integrated circuit 602, may be controlled to assure turned on-off switching.

The number of adjustment elements in gain adjustment and that in offset canceling operation may be determined by binary search, so that the latches and the times of feedback operation may be reduced further.

The entire disclosure of Japanese patent application No. 2007-110204 filed on Apr. 19, 2007, including the specification, claims, accompanying drawings and the abstract of the disclosure, is incorporated by reference in its entirety.

While the present invention has been described with reference to the particular illustrative embodiments, it is not restricted by the embodiments. It is to be appreciated that those skilled in the art can change or modify the embodiments without departing from the scope and the spirit of the present invention.

What is claimed is:

1. An offset canceller for canceling an offset across a plurality of driver integrated circuit (IC) chips driving a display apparatus, wherein
each of said driver integrated circuit chips includes:
a signal divider to receive an external analog signal and providing a plurality of divided analog output signals;
a reference voltage generator having an output port providing a reference voltage for an offset cancelling operation, a first input and a second input, the first input of the reference voltage generator is connected to an external DC reference signal, and the second input of the reference voltage generator is connected to one of the plurality of outputs from the signal divider;
a decision circuit having an output port providing a decision output signal, a first input and a second input, the first input of the decision circuit is connected to the output port of the reference voltage generator to receive the reference voltage for the offset cancelling operation;
a plurality of output circuits, wherein the number of output circuits is a natural number n+1, each of the plurality of output circuits includes a plurality of inputs and a plurality of outputs, each of the plurality of output circuits receives an analog output signal from the signal divider, and each of the plurality of the output circuits is connected to the output port of the decision circuit to receive the decision output signal as a feedback signal, and each of the plurality of output circuits provides an output connected to the second input of the decision circuit, and each of the output circuits receives the external DC reference signal;

a plurality of output selectors connected to the plurality of output circuits, wherein the number of output selector is a natural number n;

a plurality of display data outputs, wherein the number of display data outputs is a natural number n, and the number of output circuits is greater than the number of display outputs; and a memory provided in each of said output circuits;

wherein one of said output circuits corresponding in number to the plurality of display data outputs producing outputs corresponding to display data on the display apparatus, at least one of the remaining output circuits comparing the outputs thereof with the reference voltage to store a value corresponding to an offset of said output circuit in said memory to cancel the offset of said output circuits sequentially, the output port of the reference voltage generator of each of the driver integrated circuit chips is connected an output pad of the driver integrated circuit chip.

* * * * *